(12) United States Patent
Choi et al.

(10) Patent No.: US 7,359,461 B2
(45) Date of Patent: Apr. 15, 2008

(54) APPARATUS AND METHOD FOR RECOVERING CLOCK SIGNAL FROM BURST MODE SIGNAL

(75) Inventors: Jee-Yon Choi, Daejon (KR); Hyun-Ha Hong, Dajeon (KR); Hae-Geun Kim, Daejon (KR); Jong-Hyun Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 740 days.

(21) Appl. No.: 10/423,673

(22) Filed: Apr. 24, 2003

(65) Prior Publication Data
US 2004/0052316 A1    Mar. 18, 2004

(30) Foreign Application Priority Data
Sep. 18, 2002   (KR) ...................... 10-2002-0056806

(51) Int. Cl.
*H04L 27/14*   (2006.01)
(52) U.S. Cl. ........................................ 375/326; 327/165
(58) Field of Classification Search ................ 375/326, 375/355, 359, 371, 373; 713/400; 327/165, 327/166, 176; 370/395.62; 398/155; 714/20
See application file for complete search history.

(56) References Cited

U.S. PATENT DOCUMENTS

| | | | |
|---|---|---|---|
| 4,604,756 A * | 8/1986 | Moustakas et al. | ......... 375/364 |
| 6,259,326 B1 | 7/2001 | Dunlop et al. | |
| 6,298,104 B1 | 10/2001 | Saeki | |
| 2002/0090044 A1* | 7/2002 | Lee et al. | .................... 375/373 |
| 2004/0052316 A1* | 3/2004 | Choi et al. | .................. 375/326 |

FOREIGN PATENT DOCUMENTS

| | | |
|---|---|---|
| JP | 06-053950 | 2/1994 |
| JP | 06-224893 | 8/1994 |
| JP | 11-032031 | 2/1999 |
| KR | 010000854 | 1/2001 |

OTHER PUBLICATIONS

Electronics Letters, Nov. 5, 1992, vol. 28, No. 23, "Clock Recovery Circuits with Instantaneous Locking", M. Banu, et al., 4 pages.

* cited by examiner

*Primary Examiner*—Khai Tran
(74) *Attorney, Agent, or Firm*—Blakely, Sokoloff, Taylor & Zafman LLP

(57) ABSTRACT

There are provided an apparatus and method for recovering a clock signal from a burst mode signal. A first delay delays an input data signal for half of a time period of the input data signal, and produces a first delay signal. An XOR gate adds the input data signal and the first delay signal provided from the first delay, and provides an inverted signal of the added signal. An OR gate adds an output signal of the XOR gate and a second delay signal, and provides the added signal as a recovered clock signal. A second delay delays the added signal provided from the OR gate for an integer multiple of a time period of the input data signal, and produces the second delay signal that is provided to the OR gate. The frequency of the recovered clock signal is not limited by any delay in the gate elements due to a phase transition of the input data signal occurring when every other packet is provided.

11 Claims, 4 Drawing Sheets

APPARATUS AND METHOD FOR RECOVERING CLOCK SIGNAL FROM BURST MODE SIGNAL

This application claims the priority of Korean Patent Application No. 2002-56806, filed on Sep. 18, 2002, in the Korean Intellectual Property Office, the disclosure of which is incorporated herein in its entirety by reference.

BACKGROUND OF THE INVENTION

1. Field of the Invention

The present invention relates to a clock recovery apparatus and method for recovering clock signals from data signals, and more particularly, to a clock recovery apparatus and method for recovering clock signals from burst mode data signals having different phases for different packets.

2. Description of the Related Art

Typically, a clock recovery apparatus incorporates a phase loop lock (PLL) circuit to recover a clock signal having the same phase with an input data signal by adjusting a control voltage of a voltage controlled oscillator (VCO) with a feedback signal to eliminate a phase difference between the clock signal generated by the VCO and the input data signal. However, it takes too long time for the typical clock recovery apparatus to synchronize the phases of the two signals, and therefore, the typical clock recovery apparatus is inapplicable to a burst mode data signal having a phase varying with every other packet. Thus, in order to recover the clock signal from the burst mode data signal, a burst mode clock recovery apparatus is required.

Conventionally, the burst mode clock recovery apparatus incorporates a plurality of gated oscillators, as shown in FIG. 1. Referring to FIG. 1, a conventional burst mode clock recovery circuit includes a plurality of gated oscillators 110 and 120, an inverter 130 for inverting an input data signal A and providing the inverted input data signal to one of the gated oscillators 110 and 120, and a NOR gate 140 for NOR operating output signals B and C of the gated oscillators 110 and 120 and outputting a NOR operated signal D.

Each of the gated oscillators 110 and 120 includes a NOR gate 112 or 122, and a delay circuit 114 or 124 for delaying the output signal B or C of the gated oscillator 112 or 122 for half of a time period of the data signal, T/2, and feeding the delayed signal back to the NOR gate 112 or 122. When the input data signal is high, each of the gated oscillators 110 and 120 outputs a low signal. When the input data signal is low, each of the gated oscillators 110 and 120 outputs a high signal for a predetermined time of T/2, and then, a low signal after the predetermined time of T/2 as the high signal is fed back to each of the NOR gates 112 and 122 through each of the delay circuits 114 and 124. If the input data signal is kept low, then the output signal of each of the gated oscillators 110 and 120 repeats high and low for every other predetermined time of T/2.

Therefore, it is possible to recover a clock signal having a time period of T using a pair of gated oscillators 110 and 120 as described above, one of which is provided with an inverted input data signal through an inverter 130, and a NOR gate 140 for adding output signals of the gated oscillators.

FIG. 2 is a timing chart of the signals for the elements included in the conventional burst mode clock recovery apparatus. As shown in FIG. 2, if the phase of the input data signal is transited, the clock signal is also transited in accordance with the phase transition of the input data signal.

The frequency of the clock signal that can be recovered by the conventional burst mode clock recovery apparatus is determined by the time difference of the input signals to the NOR gates 112 and 122 of the gated oscillators 110 and 120. Accordingly, in an ideal case where there are no time delays in the NOR gates 112 and 122, and if the time delays of the delay circuits 114 and 124 are T/2, respectively, the frequency of the recovered clock signal is 1/T.

However, since the NOR gates 112 and 122 actually lead to time delays, and the time delays induced by the NOR gates 112 and 112 become greater as the frequency of the data signal increases, the frequency of the clock signal recovered by the conventional burst mode clock recovery apparatus is limited to 1/T which can be achieved only when the NOR gates 112 and 122 are simultaneously characterized by the time delays of T/2. Therefore, the conventional burst mode clock recovery apparatus cannot be used in a high-speed packet communication system such as an optical packet switching system for processing data at a frequency of 10 GHz or higher.

SUMMARY OF THE INVENTION

The present invention provides an apparatus and method for recovering clock signals from burst mode signals, which can be used in a high-speed packet communication system such as an optical packet switching system for processing data at a very high frequency.

A burst mode clock recovery apparatus, according to the present invention, includes an edge detection unit that detects an edge of an input data signal from a first delay signal obtained by delaying the input data signal for a first predetermined time; and a clock signal recovery unit that compensates for the non-edge portion of the input data signal using an output signal of the edge detection unit and a feedback signal obtained by delaying the output signal of the edge detection unit for a second predetermined time and provides the compensated signal as a recovered clock signal.

The edge detection unit includes a first delay for delaying the input data signal for half of a time period of the input data signal, and an XOR gate for XOR operating the input data signal and an output signal of the first delay.

The clock signal recovery unit includes a second delay for delaying an input signal provided thereto for an integer multiple of a time period of the input data signal, and an OR gate for OR operating an output signal of the edge detection unit and an output signal of the second delay and providing the OR operated signal as a recovered clock signal, wherein the signal inputted to the second delay is provided from the OR gate.

The clock signal recovery unit may be comprised of a second delay for delaying an input signal provided thereto for an integer multiple of a time period of the input data signal, a third delay for delaying an input signal provided thereto for half of the time period of the input data signal, an OR gate for OR operating an output signal of the edge detection unit and an output signal of the second delay, and an AND gate for AND operating an output signal of the OR gate and an output signal of the third delay and providing the AND operated signal as a recovered clock signal, wherein the signal inputted to the second delay is provided from the AND gate, and the signal inputted to the third delay is an inverted signal of the output signal of the edge detection unit.

The clock signal recovery unit may further include an inverter for inverting the recovered clock signal in accordance with a phase inversion of the input data signal.

In the burst mode clock recovery apparatus according to the present invention, the input data signal includes a preamble data signal having a time period corresponding to a value obtained by dividing an added value of a time delay of the OR gate and that of the AND gate by a time period of the input data signal.

A burst mode clock recovery method, according to the present invention, includes the steps of detecting an edge of an input data signal from a first delay signal obtained by delaying the input data signal for a first predetermined time; and compensating for the non-edge portion of the input data signal based on a signal corresponding to the detected edge and a feedback signal obtained by delaying the signal corresponding to the detected edge for a second predetermined time, and providing the compensated signal as a recovered clock signal.

The detection step includes the sub-steps of producing a first delay signal obtained by delaying the input data signal for half of a time period of the input data signal, and XOR operating the input data signal and the first delay signal.

The compensation step includes the sub-steps of OR operating the inverted signal obtained in step of the detection and a second delay signal, and providing the OR operated signal as a recovered clock signal; and delaying the recovered clock signal for an integer multiple of a time period of the input data signal, and producing the second delay signal.

The compensation step may include the sub-steps of OR operating the inverted signal obtained in the detection step and a second delay signal, and producing a first calculated signal; delaying an inverted signal of the first calculated signal for an integer multiple of a time period of the input data signal, and producing a second delay signal; and AND operating the first calculated signal and a third delay signal, and providing the multiplied signal as a recovered clock signal, wherein the third delay signal is produced by delaying the recovered clock signal for half of the time period of the input data signal.

The compensation step may further include the sub-step of inverting the recovered clock signal in accordance with the phase inversion of the input data signal.

In the burst mode clock recovery method according to the present invention, the input data signal includes a preamble data signal having a time period corresponding to a value obtained by diving an added value of time delays occurred in the first calculated signal production step and the recovered clock signal provision step by a time period of the input data signal.

According to the present invention, the frequency of the recovered clock signal is not limited by any delay in the gate elements due to phase transition of the input data signal occurred when every other packet is provided.

BRIEF DESCRIPTION OF THE DRAWINGS

The above aspects and advantages of the present invention will become more apparent by describing preferred embodiments thereof with reference to the attached drawings in which.

DETAILED DESCRIPTION OF THE INVENTION

Figure 1:
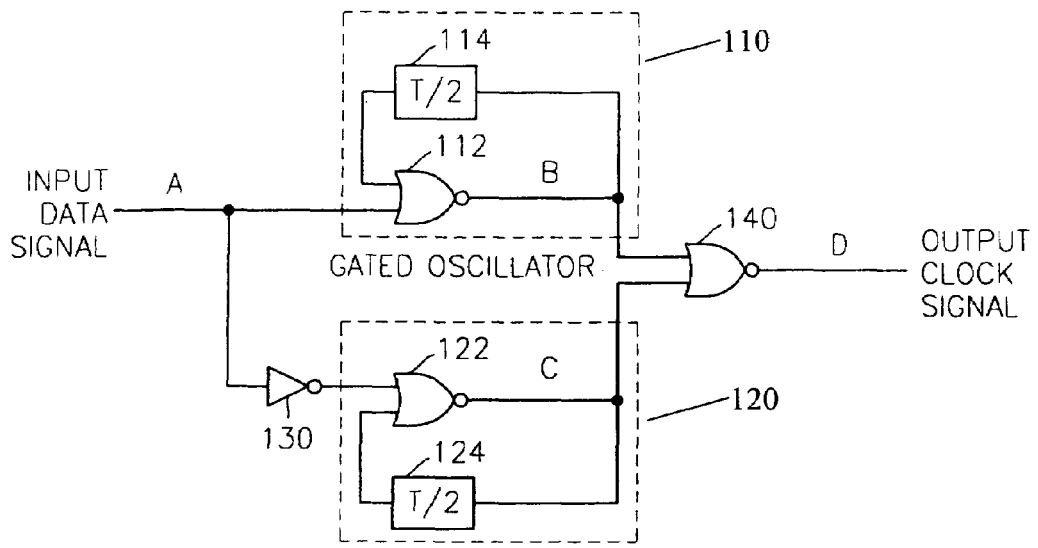
FIG. 1 is a block diagram of a conventional burst mode clock recovery apparatus.
Figure 2:
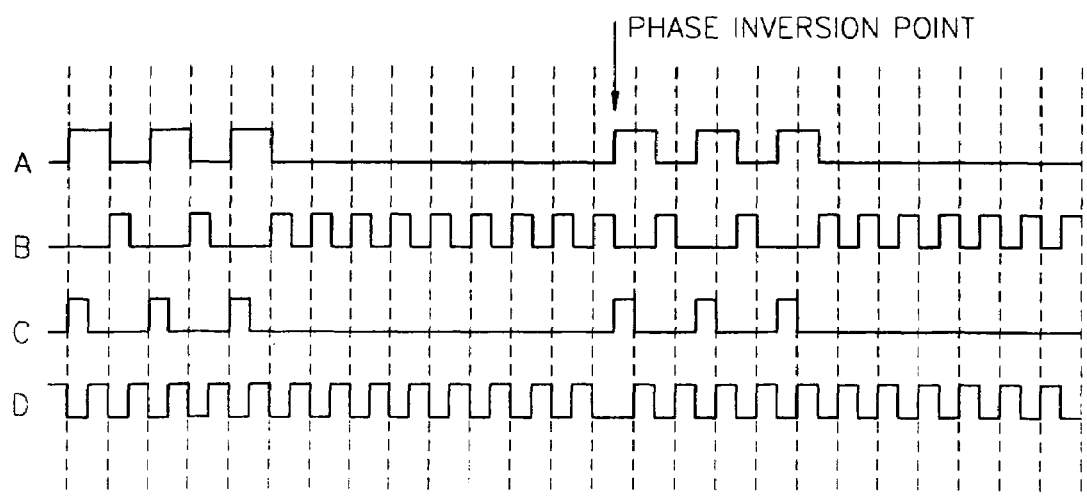
FIG. 2 is a timing chart of the conventional burst mode clock recovery apparatus shown in FIG. 1.
Figure 3:
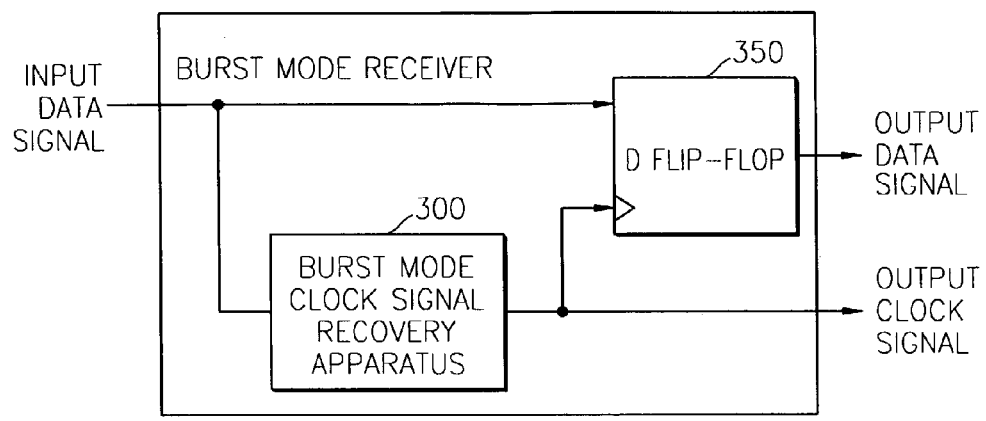
FIG. 3 is a block diagram of a burst mode receiver including a burst mode clock recovery apparatus according to the present invention.

FIG. 3 schematically shows a burst mode receiver into which a burst mode clock recovery apparatus according to the present invention can be incorporated. Referring to FIG. 3, the burst mode receiver includes a burst mode clock recovery apparatus 300 and a D flip-flop 350. The burst mode clock recovery apparatus 300 recovers a clock signal from an input burst mode data signal. The D flip-flop 350 recovers a data signal from the input data signal in accordance with the clock signal provided from the burst mode clock recovery apparatus 300. Therefore, when a burst mode data signal is received as an input data signal, the burst mode receiver outputs a clock signal and a data signal having phases correlated with each other.

Figure 4:
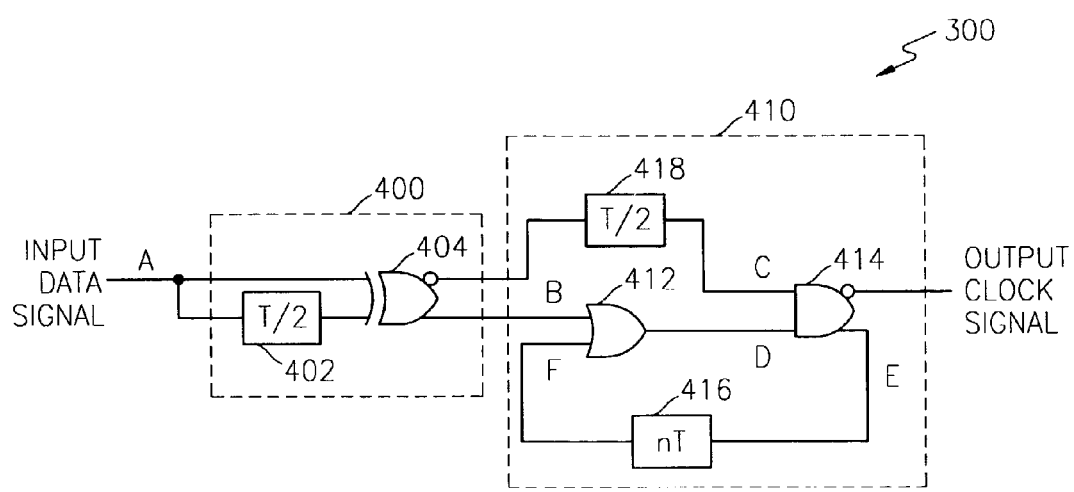
FIG. 4 is a block diagram of a burst mode clock recovery apparatus according to a preferred embodiment of the present invention.

FIG. 4 is a block diagram of a burst mode clock recovery apparatus according to a preferred embodiment of the present invention. Referring to FIG. 4, the burst mode clock recovery apparatus 300 includes an edge detection unit 400 and a clock signal recovery unit 410.

The edge detection unit 400 includes a first delay 402 for delaying an input data signal A for half of a time period thereof, T/2, and an XOR gate 404 for XOR operating the input data signal A and an output signal of the first delay 402, and producing an XOR operated signal B. When the XOR gate 404 receives a delay signal of the input data signal A, which is delayed for a time of T/2, and if the input data signal is changed from high to low and vice versa, the input signals to the XOR gate 404 are exclusive with each other, and therefore, the XOR gate 404 outputs a high signal for a time of T/2, whereby an edge of the input data signal can be detected.

The clock signal recovery unit 410 includes an OR gate 412, an AND gate 414, a second delay 416, and a third delay 418. The OR gate 412 performs an OR operation of an output signal B of the edge detection unit 400 and a delay signal F that is delayed for an integer multiple of a time period of the input data signal, nT, and produces an OR operated signal D. Through the operations as described above, the OR gate 412 compensates for the non-edge portion of the input data signal to have a format of a clock signal. The second delay 416 delays an output signal D of the OR gate 412 for a time of nT, and feeds the delayed signal back to the OR gate 412.

The clock signal is basically recovered through the OR gate 412. However, if there is a time difference between an output signal B of the XOR gate 404 and a feedback signal F from the second delay 416, the pulse width of the output signal D of the OR gate 412 increases due to a time delay of the OR gate 412 itself. To prevent this problem, the AND gate 414 is used to AND operate the output signal D of the OR gate 412 by a delay signal C, which is obtained by delaying an inverted signal of the output signal of the XOR gate 404 for a time of T/2 through the third delay, and the OR gate 412 is provided with a delay signal F obtained by delaying an output signal E of the AND gate 404 for a time of nT through the second delay 416.

The delays 402, 416, and 418 and the gate elements 404, 412, 414 are characterized by the following relationship. While there is a time difference of T/2 between two input signals to the XOR gate 404 for detecting the edge of the input data signal, a time delay of any one of the two input signals is determined by the first delay 402, and a time delay in the XOR gate 404 can be neglected.

Further, while a time difference between two input signals to the OR gate 412 is caused by a time delay in the OR gate 412, a time delay in the AND gate 414, and a time delay in the second delay 416, the time delay is determined to be an integer multiple of a time period of the input data signal, nT, and therefore, the operational frequency is not limited due to the delays in the above mentioned elements.

Furthermore, while a time difference between two input signals to the AND gate 414 should be T/2, one of the two input signals, i.e., the signal C passes through one more gate, i.e., the OR gate 412 than the other input signal D, and therefore, the signal C is subject to a time delay so as to adjust the time difference.

Figure 5:
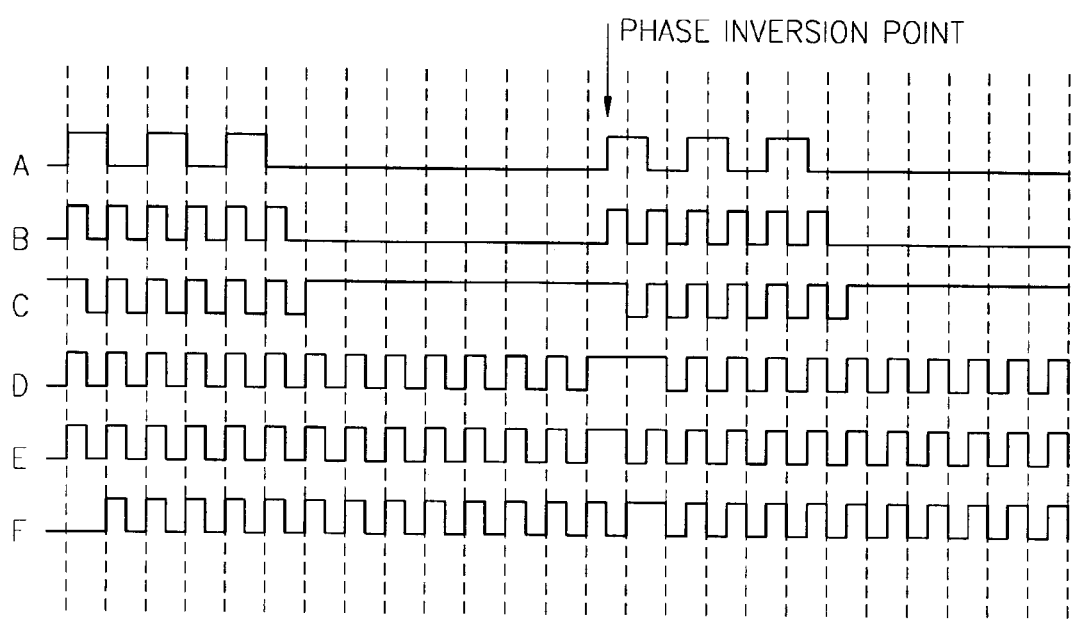
FIG. 5 is a timing chart for the burst mode clock recovery apparatus shown in FIG. 4.

If a total time delay by OR gate 412, the AND gate 414, and the second delay 416 is 2T, a preamble data signal consisting of the bits '10' should be included in the very first portion of a packet. Likewise, if the total time delay is an integer multiple n of the time period T of the input data signal like 3T, 4T, and so on, the preamble data signal consisting of the bits '101', '1010', and so on should be included in the very first portion of a packet. If the phase of the input data signal is transited, the phase of the recovered clock signal is also transited in accordance with the phase transition of the input data signal as shown in FIG. 5.

Figure 6:
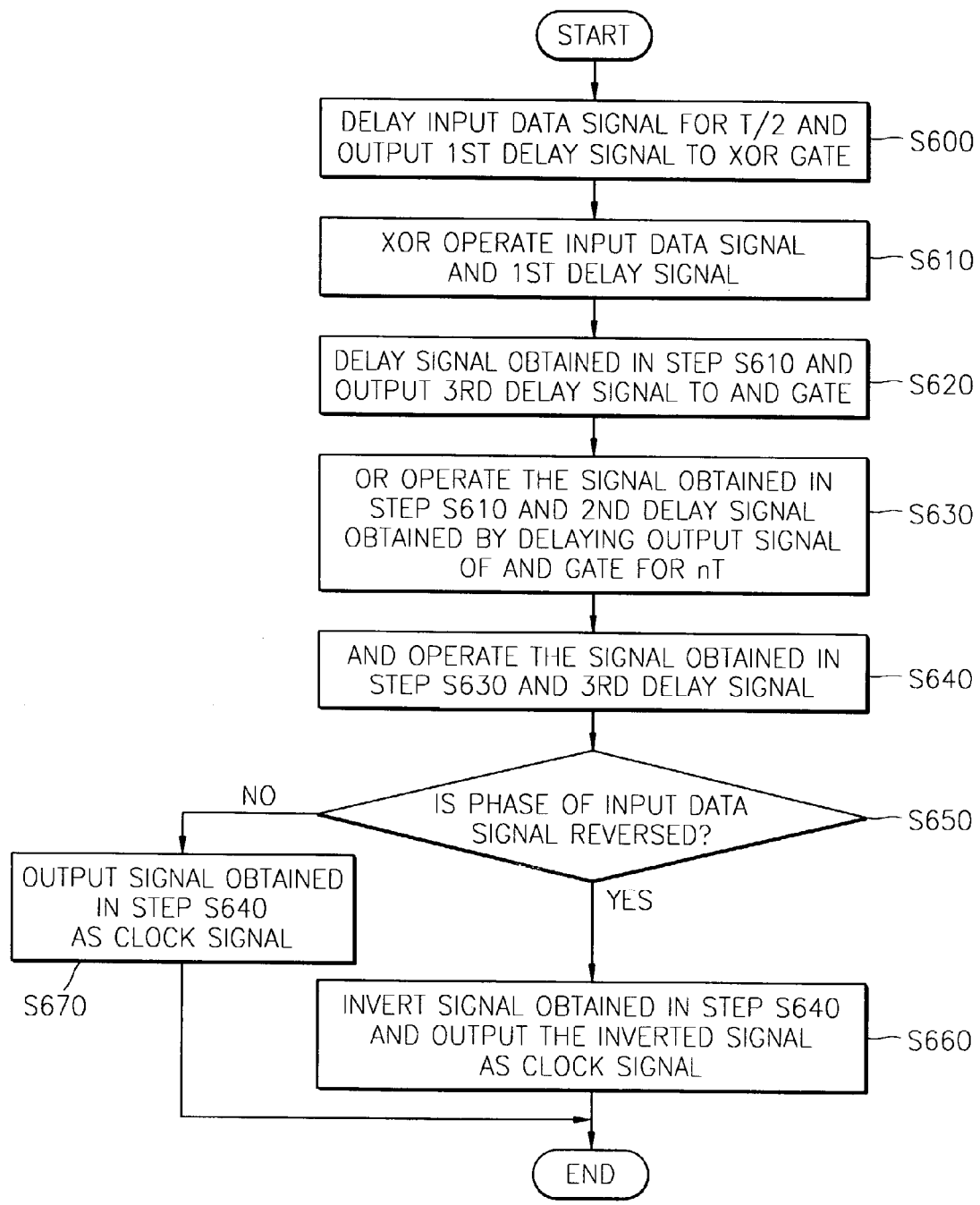
FIG. 6 is a flowchart for a burst mode clock recovery method according to the present invention.

FIG. 6 is a flowchart of a burst mode clock recovery method according to the present invention. Referring to FIG. 6, the first delay 400 delays an input data signal for half of a time period thereof, and produces a first delay signal (STEP 600). The XOR gate 404 performs an XOR operation with the input data signal and the first delay signal (STEP 610). The third delay 418 delays an inverted signal of an output signal of the XOR gate 404 for half of a time period of the input data signal, and produces a third delay signal (STEP 620). The OR gate 412 performs an OR operation of the output signal of the XOR gate 404 and a second delay signal obtained by delaying an output signal of the AND 414 gate for an integer multiple of a time period of the input data signal through the second delay 416 (STEP 630).

The AND gate 414 performs an AND operation of the third delay signal and an output signal of the OR gate 412 (STEP 640). If the phase of the input data signal is reversed (STEP 650), the output signal and the AND gate 414 is inverted, and then, the inverted signal is provided as a recovered clock signal (STEP 660). On the other hand, if the phase is not reversed, the output signal of the AND gate 414 is provided as a recovered clock signal (STEP 670).

According to the present invention, the frequency of the recovered clock signal is not limited by any time delay in the gate elements due to the transition of the phase the input data signal occurred when every other packet is provided.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A burst mode clock recovery apparatus, comprising:
an edge detection unit that operates to detect an edge of an input data signal from a first delay signal obtained by delaying the input data signal for a first predetermined time; and
a clock signal recovery unit that operates to compensate for a non-edge portion of the input data signal using an output signal of the edge detection unit and a feedback signal obtained by delaying the output signal of the edge detection unit for a second predetermined time and to provide the compensated signal as a recovered clock signal, wherein the second predetermined time is at least twice the first predetermined time, and the clock recovery unit includes a second delay for delaying an input signal provided thereto for an integer multiple of a time period of the input data signal, and a third delay for delaying an input signal provided thereto for half of the time period of the input data signal.

2. The burst mode clock recovery apparatus according to claim 1, wherein the edge detection unit includes a first delay for delaying the input data signal for half of a time period of the input data signal; and an XOR gate for XOR operating the input data signal and an output signal of the first delay.

3. The burst mode clock recovery apparatus according to claim 1, wherein the clock signal recovery unit includes a second delay for delaying an input signal provided thereto for an integer multiple of a time period of the input data signal; and an OR gate for performing an OR operation of an output signal of the edge detection unit and an output signal of the second delay and providing the OR operated signal as a recovered clock signal, wherein the signal inputted to the second delay is provided from the OR gate.

4. The burst mode clock recovery apparatus according to claim 1, wherein the clock signal recovery unit includes an OR gate for performing an OR operation of an output signal of the edge detection unit and an output signal of the second delay; and an AND gate for an AND operation of an output signal of the OR gate and an output signal of the third delay and providing the AND operated signal as a recovered clock signal, wherein the signal inputted to the second delay is provided from the AND gate, and the signal inputted to the third delay is an inverted signal of the output signal of the edge detection unit.

5. The burst mode clock recovery apparatus according to claim 4, wherein the clock signal recovery unit further includes an inverter for inverting the recovered clock signal in accordance with a phase inversion of the input data signal.

6. The burst mode clock recovery apparatus according to claim 4, wherein the input data signal includes a preamble data signal having a time period corresponding to a value obtained by dividing an added value of a time delay of the OR gate and that of the AND gate by a time period of the input data signal.

7. A burst mode clock recovery method, comprising:
detecting an edge of an input data signal from a first delay signal obtained by delaying the input data signal for a first predetermined time; and
compensating for a non-edge portion of the input data signal based on a signal corresponding to the detected edge and a feedback signal obtained by delaying the signal corresponding to the detected edge for a second predetermined time, and providing the compensated signal as a recovered clock signal, OR operating the signal obtained as a result of the detecting and a second delay signal, producing a first calculated signal, and delaying an inverted signal of the first calculated signal for an integer multiple of a time period of the input data signal, and producing a second delay signal, AND operating the first calculated signal and a third delay signal, and providing the AND operated signal as the recovered clock signal, and wherein the third delay signal is produced by delaying the recovered clock signal for half of the time period of the input data signal, wherein the second predetermined time is at least twice the first predetermined time.

8. The burst mode clock recovery method according to claim 7, wherein the first predetermined time is half of a time period of the input data signal, and the detecting includes XOR operating the input data signal and the first delay signal.

9. The burst mode clock recovery method according to claim 7, wherein the compensating includes:

OR operating the signal obtained in the detecting and the second delay signal, and providing the OR operated signal as the recovered clock signal, and delaying the recovered clock signal for an integer multiple of a time period of the input data signal, and producing the second delay signal.

10. The burst mode clock recovery method according to claim 7, wherein the compensating further includes inverting the recovered clock signal in accordance with a phase inversion of the input data signal.

11. The burst mode clock recovery method according to claim 7, wherein the input data signal includes a preamble data signal having a time period corresponding to a value obtained by dividing an added value of time delays created during the first calculated signal production and the recovered clock signal.

* * * * *